(12) United States Patent
Noro et al.

(10) Patent No.: US 7,583,237 B2
(45) Date of Patent: Sep. 1, 2009

(54) ANTENNA MODULE HAVING A MULTILAYERED SUBSTRATE WITH BUILT-IN COMPONENTS WHICH ARE CONNECTED TO MOUNTED COMPONENTS

(75) Inventors: Junichi Noro, Akita (JP); Makoto Abe, Akita (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 11/668,843

(22) Filed: Jan. 30, 2007

(65) Prior Publication Data
US 2007/0290929 A1 Dec. 20, 2007

(30) Foreign Application Priority Data
Mar. 8, 2006 (JP) .................... P2006-062660

(51) Int. Cl.
H01Q 1/38 (2006.01)
H01Q 5/00 (2006.01)
H01Q 9/04 (2006.01)
H01Q 3/10 (2006.01)
H01Q 3/00 (2006.01)
H01P 5/12 (2006.01)

(52) U.S. Cl. .............................. 343/860; 343/700 MS; 343/859; 333/134

(58) Field of Classification Search .......... 343/700 MS, 343/860, 859; 333/134
See application file for complete search history.

(56) References Cited

U.S. PATENT DOCUMENTS

| 4,924,236 | A  | * | 5/1990  | Schuss et al. ......... 343/700 MS |
| 6,529,096 | B2 | * | 3/2003  | Maekawa et al. ........... 333/134 |
| 6,809,688 | B2 | * | 10/2004 | Yamada ............... 343/700 MS |
| 7,132,984 | B2 | * | 11/2006 | Kameda et al. ....... 343/700 MS |
| 2004/0160368 | A1 | * | 8/2004 | Huang ................. 343/700 MS |

FOREIGN PATENT DOCUMENTS

| JP | 2004304615 | A | * | 10/2004 |
| JP | 2004320561 | A | * | 11/2004 |
| JP | 2005-109687 |   |   | 4/2005  |

* cited by examiner

*Primary Examiner*—Michael C Wimer
*Assistant Examiner*—Jennifer F. Hu
(74) *Attorney, Agent, or Firm*—Whitham Curtis Christofferson & Cook, PC

(57) ABSTRACT

A multilayered substrate includes a first layer and at least one second layer laminated on one face of the first layer. A first component is mounted on the other face of the first layer. A second component is comprised of a pattern formed on at least one second layer, and electrically connected to the first component through a via hole.

3 Claims, 13 Drawing Sheets

F I G. 4
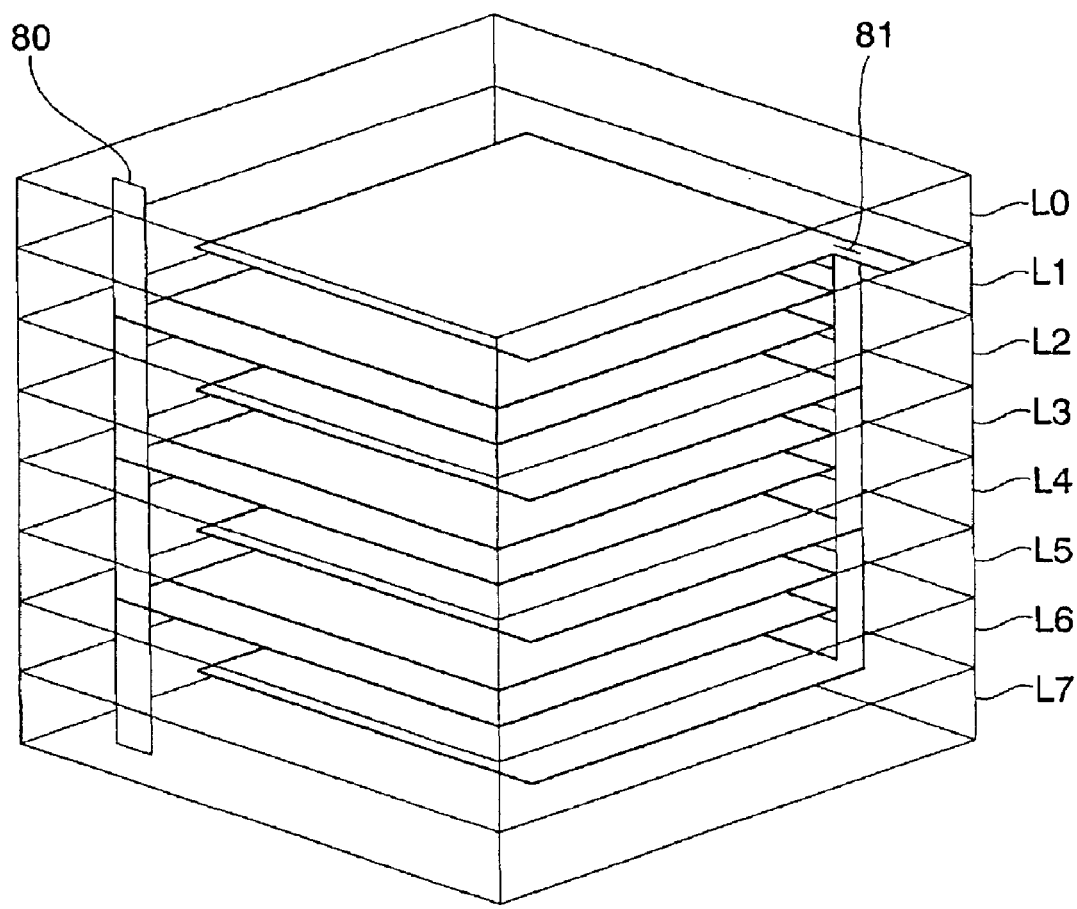

FIRST LAYER: GND LAYER — L0

SECOND LAYER 117
118 — L1

THIRD LAYER 120
119 — L2
121

FOURTH LAYER 122
123 — L3
124

FIFTH LAYER: WIRE PATTERN LAYER EXCEPT FOR FILTER — L4

SIXTH LAYER

125 — L5

SEVENTH LAYER: GND LAYER — L6

ANTENNA MODULE HAVING A MULTILAYERED SUBSTRATE WITH BUILT-IN COMPONENTS WHICH ARE CONNECTED TO MOUNTED COMPONENTS

The disclosure of Japanese Patent Application No. 2006-062660 filed Mar. 8, 2006 including specification, drawings and claims is incorporated herein by reference in its entirety.

BACKGROUND

The present invention relates to an antenna device and a reception system for receiving radio waves of digital radio broadcasting.

In recent years, a digital radio receiver which receives a satellite wave or a terrestrial wave and provides digital radio broadcasting has been developed, and has been put to practical use in the United States. The digital radio receiver is mounted in a mobile station such as a vehicle so that radio waves in a frequency band of about 2.3 GHz are received, thus making it possible to provide radio broadcasting to the vehicle, for example. That is, the digital radio receiver is a radio receiver which can provide mobile broadcasting. Since frequencies of the received radio waves are in a frequency band of about 2.3 GHz, the received wavelength (resonance wavelength) ??at that time is about 128.3 mm. Further, the terrestrial wave stems from the satellite wave being received in an earth station and then the frequency of the wave being a little shifted and the wave being re-transmitted in a form of a linearly polarized wave.

In general, when the digital radio receiver is mounted in the vehicle, the antenna device is attached on the roof of the vehicle. As shown in FIG. 1, the antenna device 10 (for example, see Japanese Patent Publication No. 2005-109687, paragraph 0016 to 0022, FIG. 1) for such the digital radio receiver includes an antenna case 13 made by coupling a top cover 11 with a bottom plate 12, an antenna module 14 disposed in the top cover 11, a packing member 15 disposed in a junction portion of the top cover 11 and the bottom plate 12 and ensuring a sealing-ability of the antenna case 13, and a signal line 16 connected to the antenna module 15.

The antenna module 14 has an antenna element 20 in which an antenna receiving a signal transmitted from a satellite is formed and a circuit board 21 in which a circuit for performing a signal processing such as amplification of the signal received by the antenna element 20 is formed. The antenna element 20 and the circuit board 21 are joined each other by a two-sided tape 22 or the like.

A coaxial cable, as a signal line 16, for fetching signals outside from the antenna case 13 is connected to the circuit board 21. Further, in the circuit board 21, a shield case 24 for shielding the circuit is attached on a main surface 21b opposite to a main surface 21a on which the antenna element 20 is disposed. The signal line 16 is drawn outside through a notch portion formed in the top cover 11.

The antenna device 10 is united in one body by assembling the top cover 11 and the bottom plate 12 with the antenna module 14 and the packing member 15 housed in the inner space of the top cover 11. The packing member 15 is made of a resin material such as an EPDM rubber.

When the top cover 11 and the bottom plate 12 are joined, the packing member 15 is interposed therebetween in order to ensure sealing-ability of the junction portion. A gasket 15b rises from a base 15a corresponding to the notch portion 11a of the top cover 11.

A single concave portion 12a is formed on the center of the bottom plate 12 and a permanent magnet 30 is disposed in the concave portion 12a. The permanent magnet 30 is disposed in order to attach the antenna device 10 on the roof of the vehicle. Further, on the outer main surface of the bottom plate 12, a resin sheet 31 for preventing a damage of the vehicle is attached over the substantially entire surface of the main surface. A product number or name of the antenna device 10 is printed on the resin sheet 31.

In the related-art antenna device having the above-mentioned structure, an antenna device in which a tuner unit is mounted has been put to practical use. In this type of the antenna device, the size of the circuit board 21 increases since the tuner unit is mounted. Consequently, the entire size of the antenna device is larger.

SUMMARY

It is therefore an object of the invention to minimize a size of the antenna module.

In order to achieve the above described object, according to the invention, there is provided an antenna module comprising:

a multilayered substrate including:
a first layer; and
at least one second layer laminated on one face of the first layer;
a first component mounted on the other face of the first layer;
a second component comprised of a pattern formed on at least one second layer, and electrically connected to the first component through a via hole.

The antenna module may be integrated in an antenna device for receiving a satellite digital radio.

For example, an LNA (Low Noise Amplifier), a demodulating circuit, and an operating circuit are configured with the first component mounted on the first layer of the multilayered substrate and the second component built in the multilayered substrate. The first component may include a plurality of mounted components. The first component or mounted components may include a tuner IC. Therefore, the antenna module may be integrated with a tuner.

The multilayered substrate may be a Low Temperature Co-fired Ceramic (LTCC) multilayered substrate.

The second component may include a reactance element formed on the basis of at least one of a width, a length, and a shape of the pattern. With this configuration, it is not necessary to separately mount a condenser element or a coil element independent of a pattern on a layer within a spatial area of the multilayered substrate. Therefore, it is possible to minimize the first component. Consequently, the minimization in entire size of the antenna device may be achieved.

The second component may include at least one of an inductor, a filter, a balun, and a capacitor. More particularly, an inductor including a pattern of a substantially concentric polygon or a substantially concentric circle is conceivable. In addition, a capacitor respectively formed on the layers and including a pattern of electrode plates facing each other is conceivable. Furthermore, a balun including a first pattern which is formed on one layer of the second layers and which is in a form of a concentric polygon or a concentric circle and a second pattern which is formed on an adjacent layer and which is a form of a concentric polygon or a concentric circle corresponding to the first pattern is conceivable.

According to the invention there is also provided an antenna module, comprising:

a multilayered substrate; and
a first component mounted on the multilayered substrate, wherein:

the multilayered substrate is an low temperature co-fired ceramic multilayered substrate.

According to the invention, there is also provided an antenna device which includes the above-described antenna module.

With this configuration, the circuit board may be minimized as much as the amount of the first components in comparison with a related-art antenna module in which all components are mounted on the first layer of the multilayered substrate. Consequently, the antenna module may be minimized, and further it is possible to minimize the antenna device.

BRIEF DESCRIPTION OF THE DRAWINGS

The above objects and advantages of the present invention will become more apparent by describing in detail preferred exemplary embodiments thereof with reference to the accompanying drawings, wherein:

FIG. 4 is a perspective view showing a capacitor according to the embodiment;

DETAILED DESCRIPTION OF THE EMBODIMENTS

Hereinafter, an embodiment of an antenna device according to the invention will be discussed with reference to the accompanying drawings.

Figure 1:
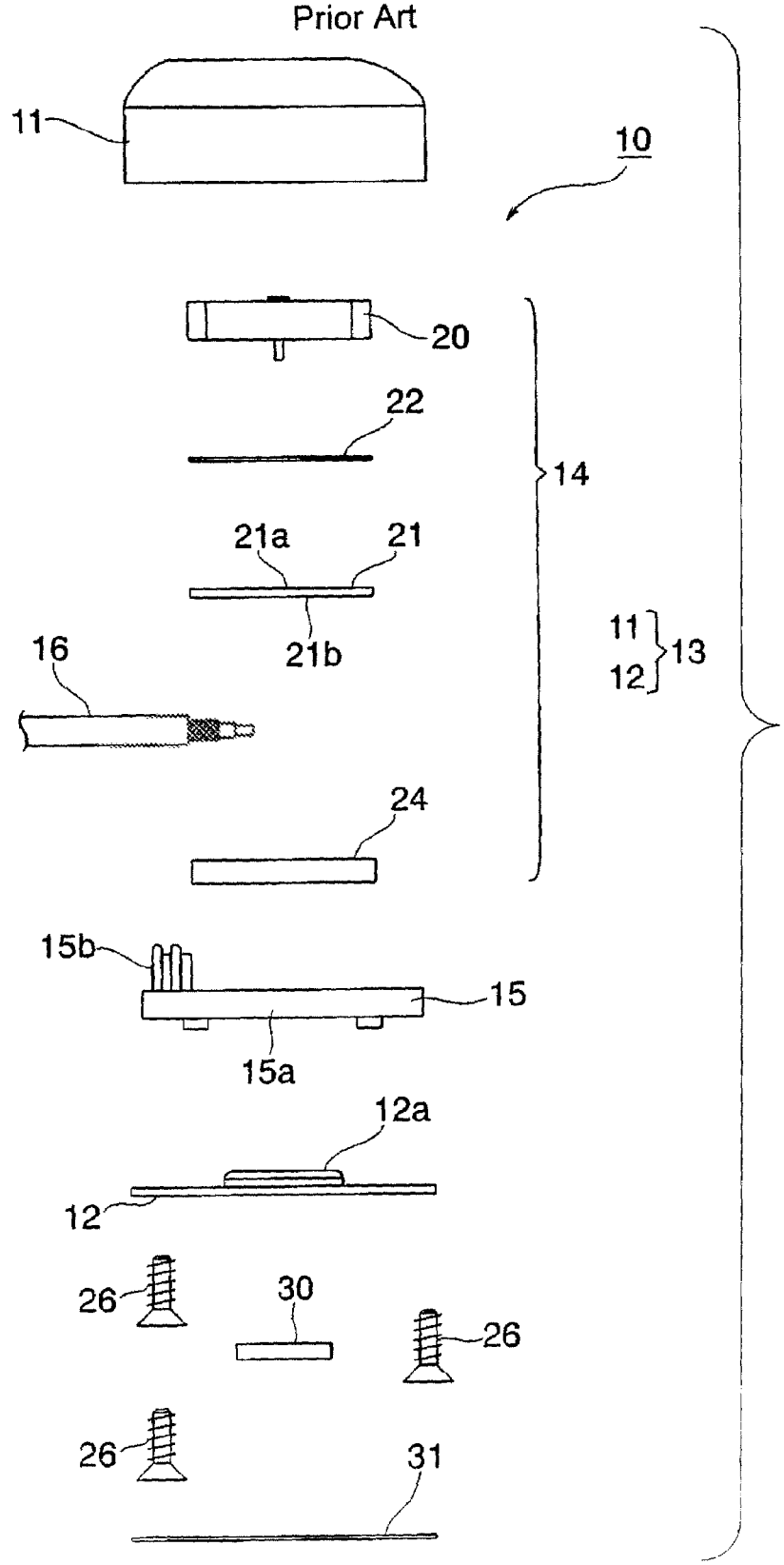
FIG. 1 is an exploded side view showing a structure of an antenna device used in the prior art and which can be used with modification according to an embodiment of the present invention.
Figure 2:
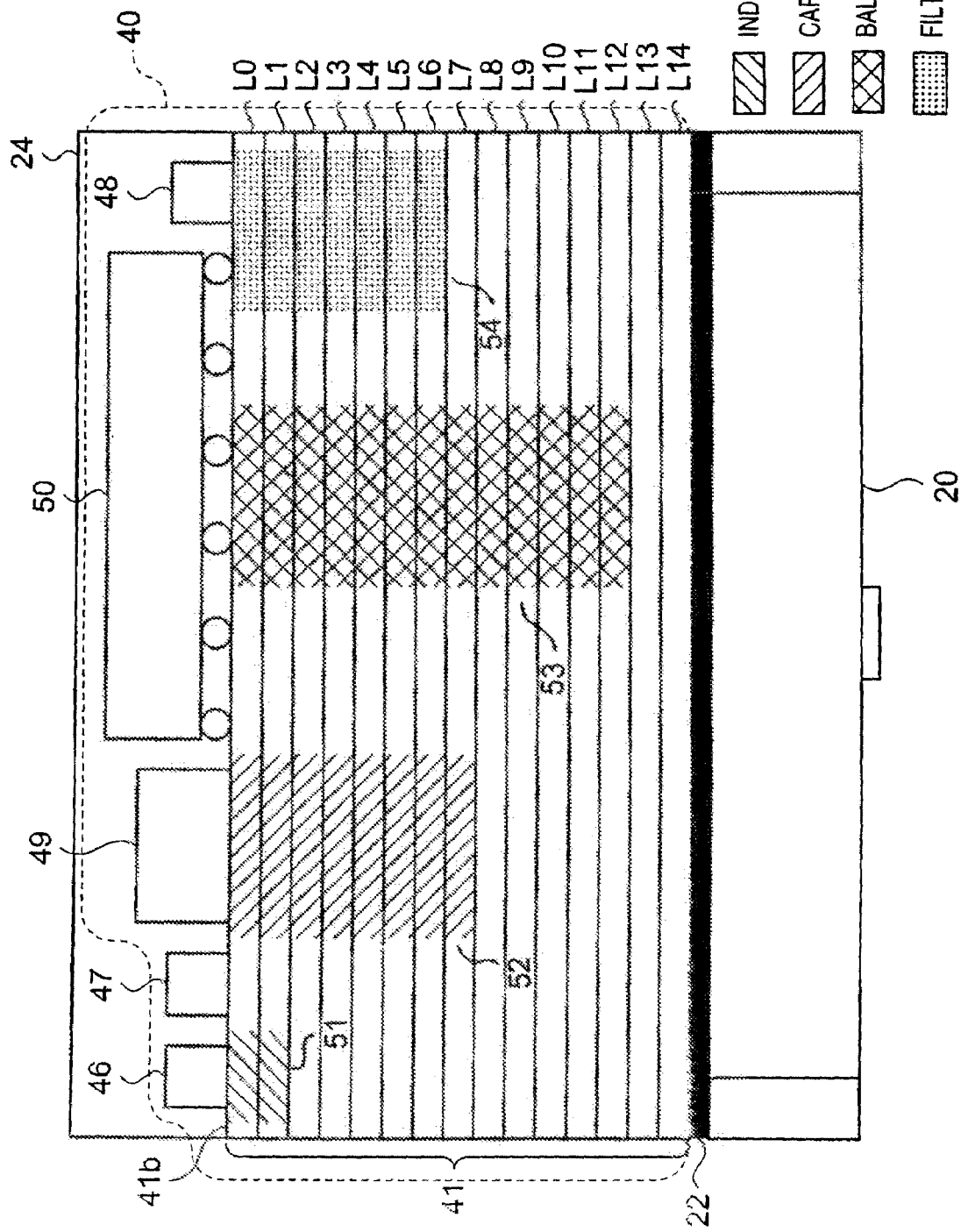
FIG. 2 is a section view showing a circuit board according to the embodiment.

A circuit board 40 according to an embodiment of the invention is described with reference to FIG. 2. The constituent elements equivalent to those of FIG. 1 are denoted by the same reference numerals. The circuit board 40 is corresponding to the circuit board 21 in FIG. 1, includes a multilayered substrate 41 and a mounted component, and an antenna module includes the circuit board 40 and an antenna element 20. The multilayered substrate 41 includes fifteen layers L0 to L14. Further, the multilayered substrate formed of fifteen layers is used in the embodiment, but the invention is not limited to the above-mentioned configurations, and a multilayered substrate formed of less or more layers than the fifteen layers may be used.

The mounted components are elements 46, 47, and 48 disposed on a main surface 41b, a crystal oscillator 49, a tuner IC 50, and built-in components, such as inductors 51, capacitors 52, baluns 53, and filters 54, disposed in inner areas 51 to 54 of the multilayered substrate 41. The mounted components on the main surface 41b and built-in components are connected through via holes, as not illustrated, passing through the multilayered substrate 41. The mounted components disposed on the main surface 41b are covered with a shield case 24.

A line width, a shape, and a length of the pattern in the layers of the multilayered substrate are properly determined and reactance elements such as a condenser and a coil are formed, the reactance elements are connected by the patterns within the same layer, and similarly are connected to the reactance elements or the wire patterns formed in the other layers through the via holes. Accordingly, the built-in components 51 to 54 are the circuits which may function as desired.

Figure 3:
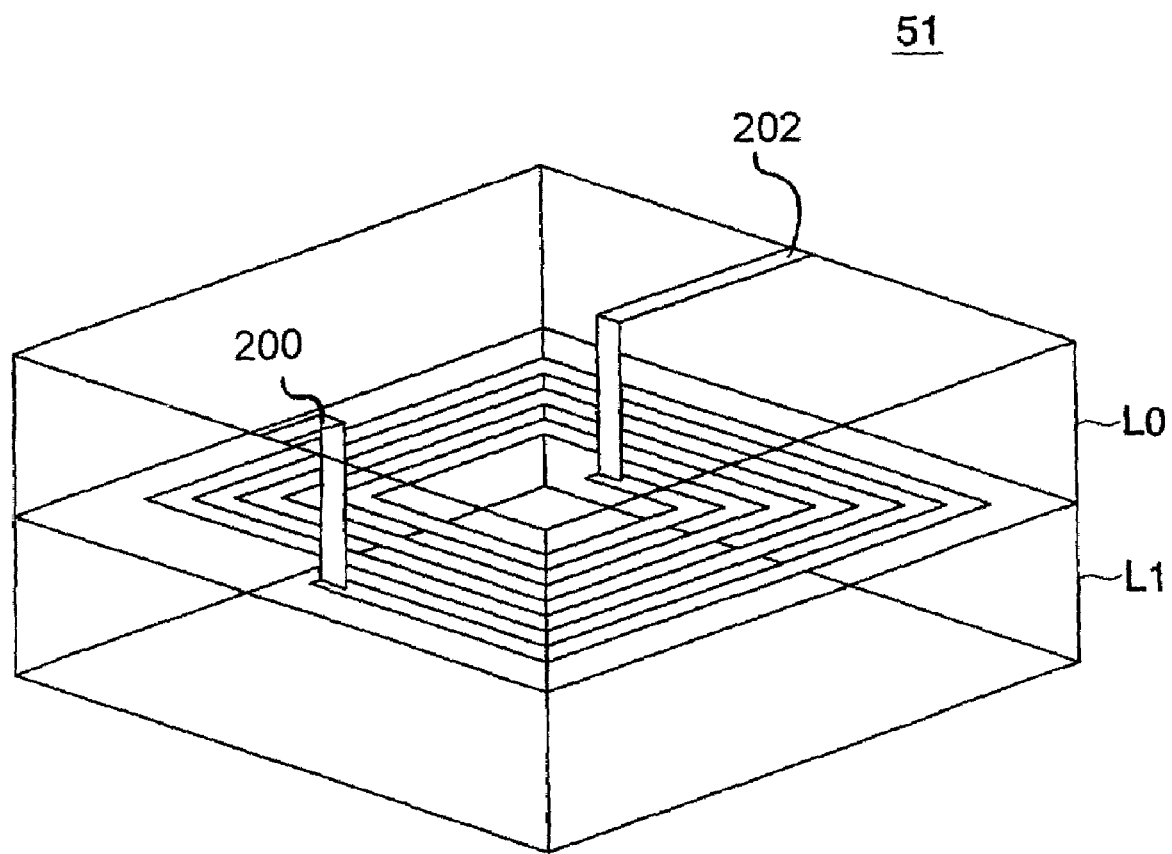
FIG. 3 is a perspective view showing an inductor according to the embodiment.

As shown in FIG. 3, the inductor 51 is formed of the pattern formed between the layer L0 and the layer L1 of the multilayered substrate 41, that is, on the layer L1. The pattern is a substantially concentric rectangle or a substantially rectangular spiral. The inductor 51 is connected to the pattern on the main surface 41b from the center end and the outer peripheral end through the via holes 200 and 202 in layer L0 hole.

Figure 5:
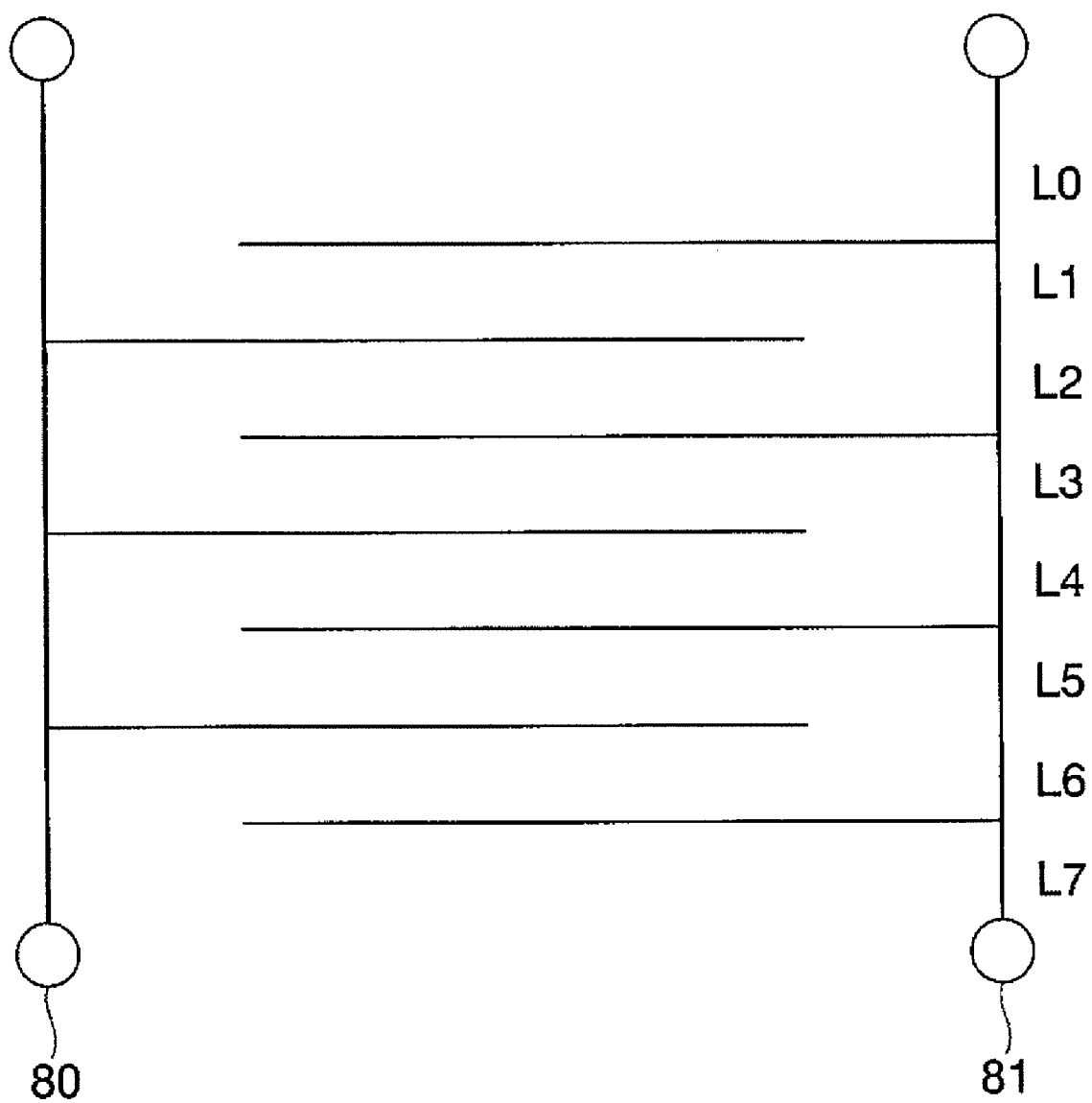
FIG. 5 is a section view showing the capacitor according to the embodiment.

As shown in FIG. 4, the capacitors 52 are formed in the eight layers of the layers L0 to L7 of the multilayered substrate 41. The two via holes 80, 81 pass through all layers and the substantially rectangular patterns are formed in the layers L1 to L7 respectively. As shown in FIG. 5, since the patterns on the layers L2, L4, and L6 are connected through the via hole 80 each other and the patterns on the layers L1, L3, L5, and L7 are connected through the via hole 81 each other, the entirety functions as a capacitor.

Figure 6:
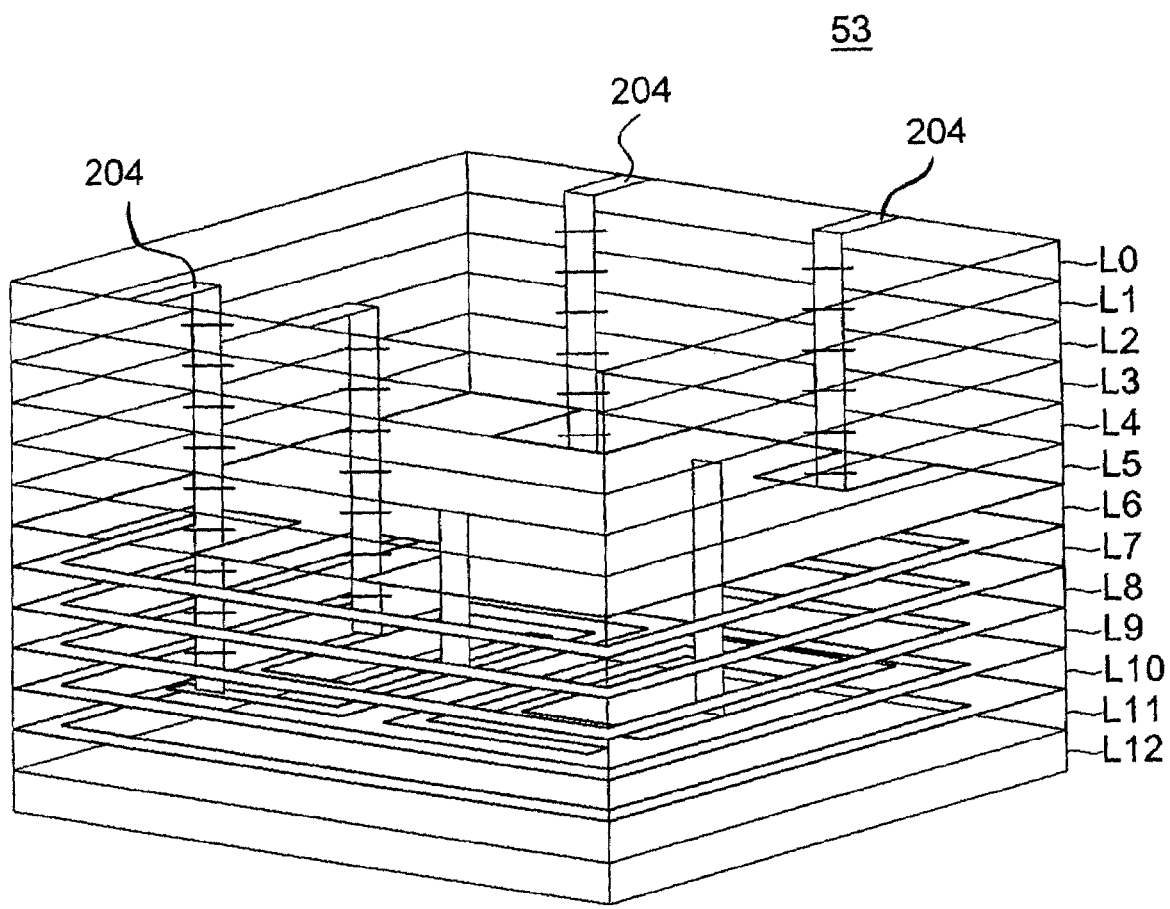
FIG. 6 is a schematic perspective view showing a balun according to the embodiment.

With reference to FIG. 6, the baluns 53 are formed of the layers L0 to L12 of the multilayered substrate, and particularly, the main parts are formed in the layers L6 to L12. The built-in components except for the baluns 53 may be formed in the layers L0 to L5. For example, it is conceivable to form an inductor such as the inductor 51. The baluns 53 are connected to the pattern on the main surface 41b through via holes 204.

Figure 7:
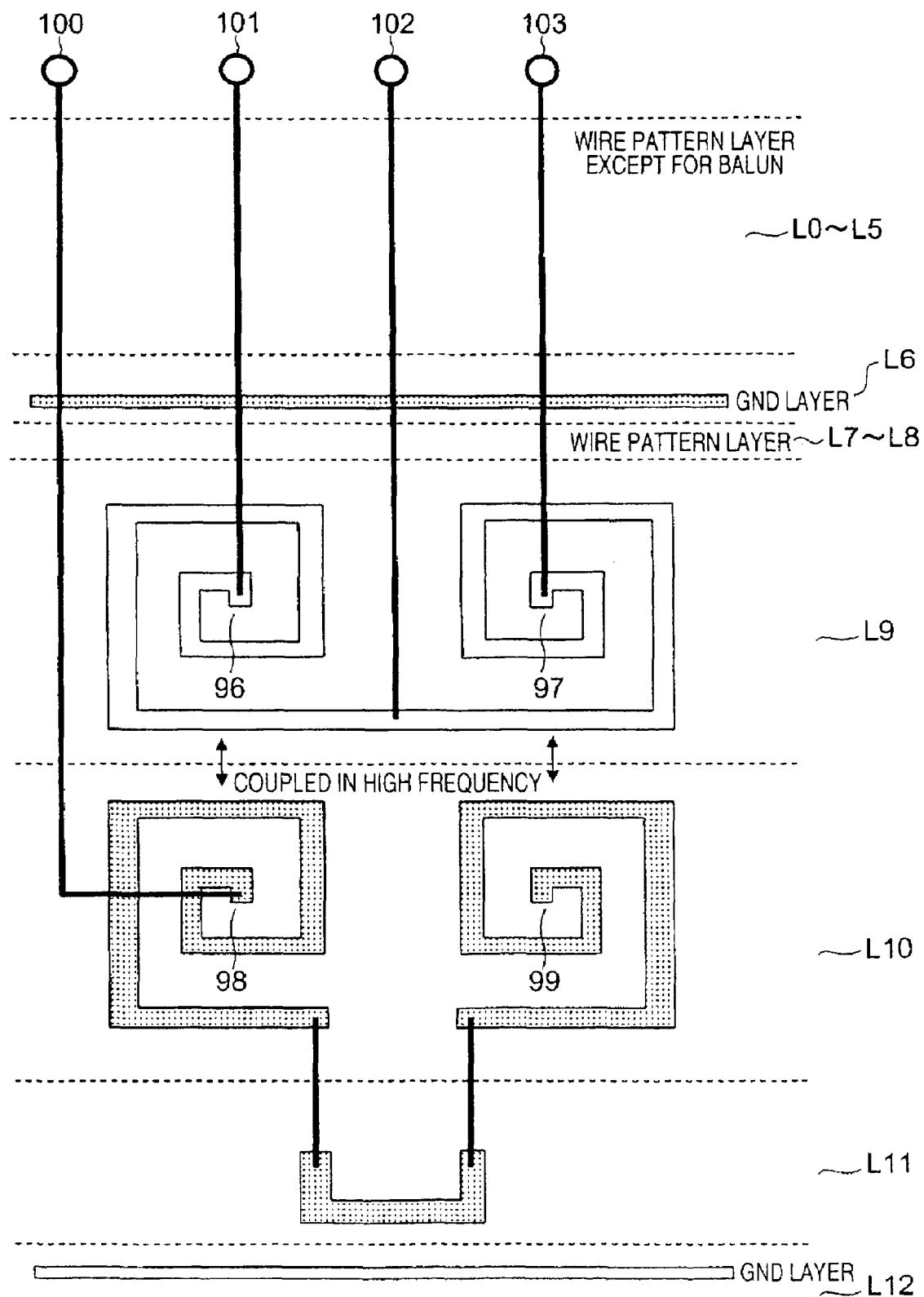
FIG. 7 is a diagram showing patterns of the balun formed on each of the layers of the multilayered substrate according to the embodiment.

A structure of the balun 53 is also described with reference to FIG. 7. The layer L6 is a GND layer. Spirals 96, 97 in a form of rectangle and patterns formed of a wire which connects the spiral 96, the spiral 97 are formed on the layer L9. Patterns formed circular spiral 98, 99 are formed also on the layer L10. Wires connecting the spirals 98, 99 are not included in the patterns of the layer L9 and the wires are formed in the pattern of the layer L11. Wire patterns are formed on the layers L7, L8 so as to lead the wire patterns the spirals 96, 97, and 98 and the wire pattern between the spiral 96 and the spiral 97 to terminals 100, 101, 102, and 102.

Figure 8:
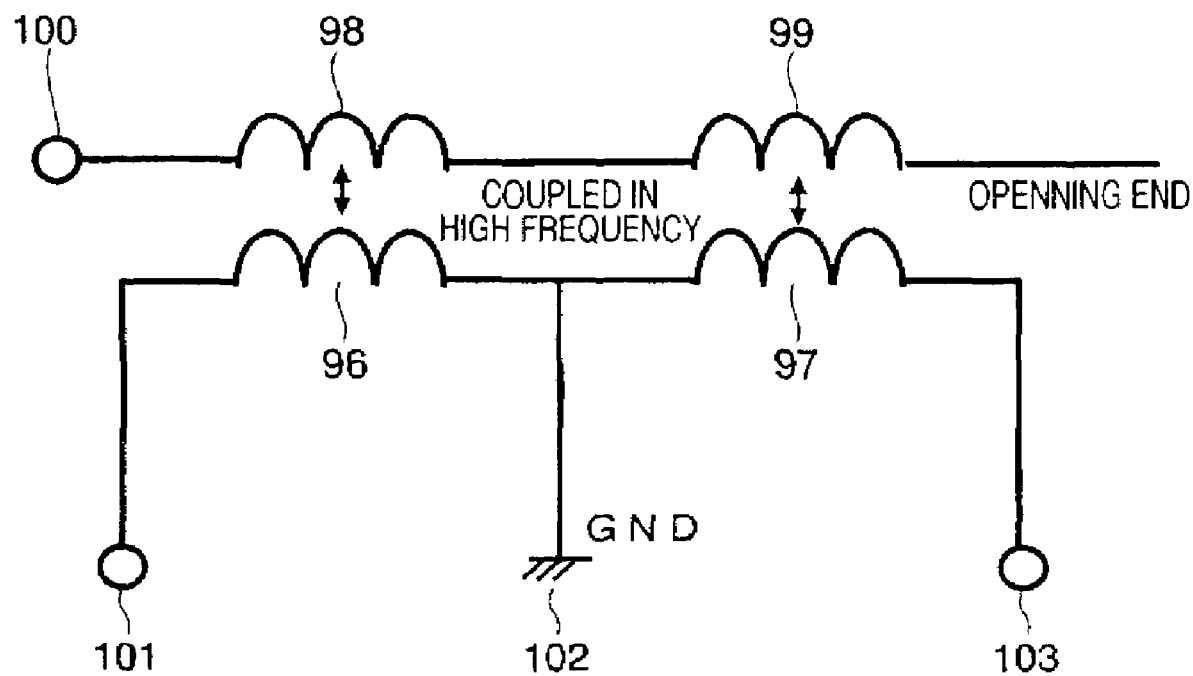
FIG. 8 is a circuit diagram showing the balun.

The terminal 100 is connected to the inner peripheral end of the spiral 98 through the via hole. The outer peripheral end of the spiral 98 is connected to one end of the pattern of the layer L11 through the via hole and the other end connected to outer peripheral end of the spiral 99 through the via hole. The terminal 101 is connected to the inner peripheral end of the spiral 96 through the via hole, the terminal 102 is connected to the wire pattern between the spiral 96 and the spiral 97 through the via hole, and the terminal 103 connected to the inner peripheral end of the spiral 97 through the via hole. Since wired between the patterns as mentioned above, the spiral 96 and the spiral 98 and the spiral 97 and the spiral 99 are coupled in a high frequency respectively. Accordingly, the balun 53 functions as a circuit shown in FIG. 8.

Figure 9:
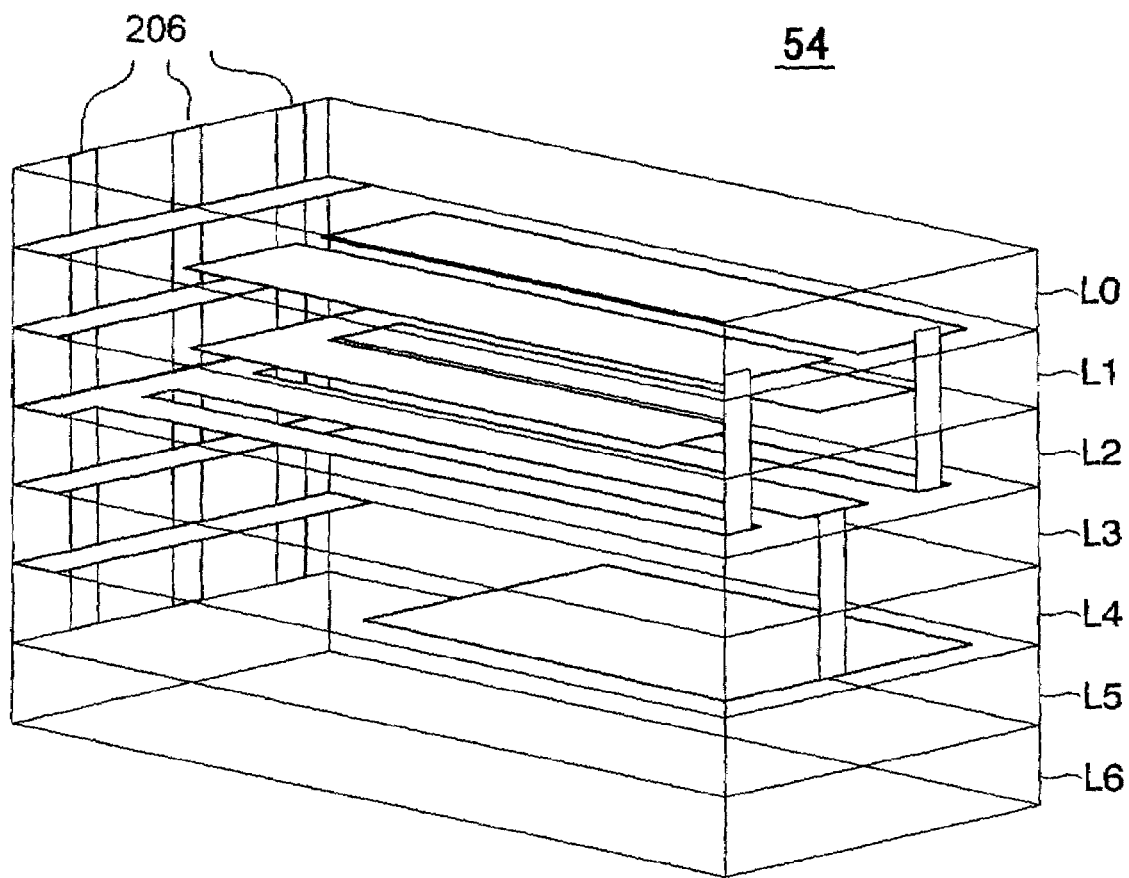
FIG. 9 is a perspective view showing a filter according to the embodiment.

The filter 54 is described with reference to FIG. 9. The multilayered substrate with the filter 54 is formed of patterns of the seven layers L0 to L6 and via holes 206 through which the patterns are connected.

Figure 10:
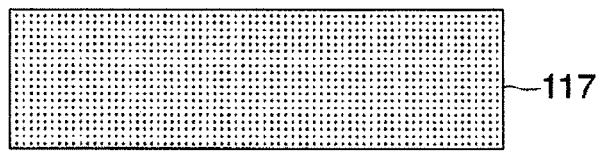
FIG. 10 is a diagram showing patterns of the filter formed on each of the layers of the multilayered substrate according to the embodiment.
Figure 10:
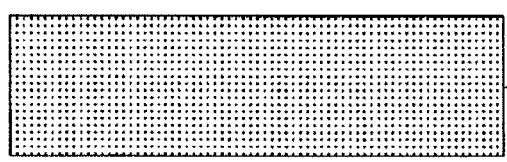
Figure 10:
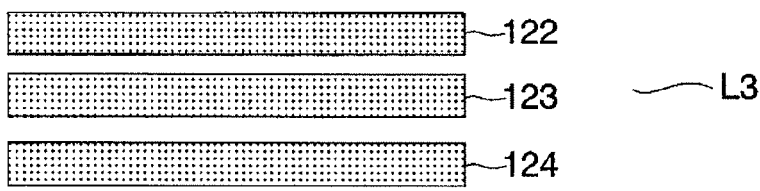
Figure 10:
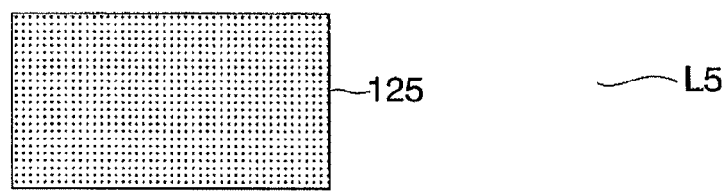
Figure 11:
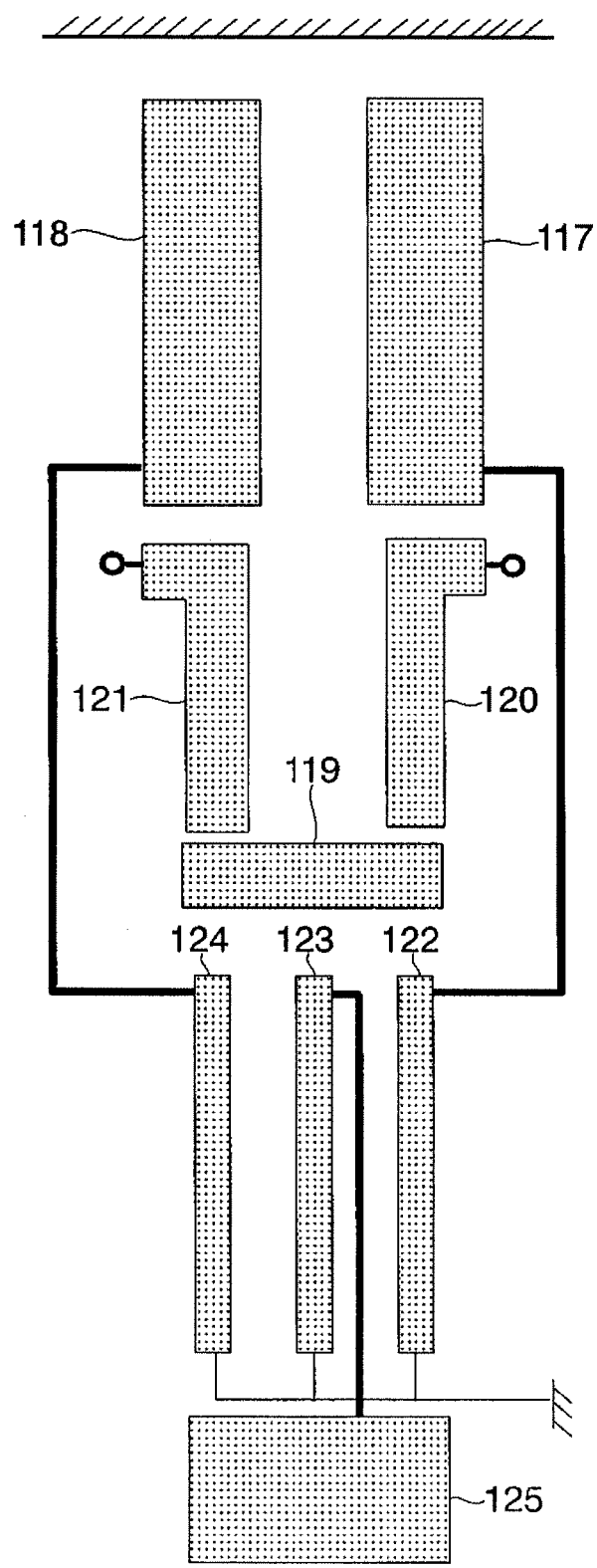
FIG. 11 is a diagram showing wired lines between the patterns of the filter.

The filter 54 is further described with reference to FIG. 10. The pattern on the layer L0 is a GND layer. The pattern on the layer L1 is formed of two rectangles 117, 118. The pattern on the layer L2 is formed of a rectangle 119, a form of an inverse L 120, and a form of L 121. The pattern on the layer L3 is formed of three rectangles 122 to 124. The pattern on the layer L4 is a wire pattern except for the filter 54. The pattern on the layer L5 is formed of a rectangle 125. The pattern on the layer L6 is a GND layer. These patterns are connected through the via holes as shown in FIG. 11.

Figure 12:
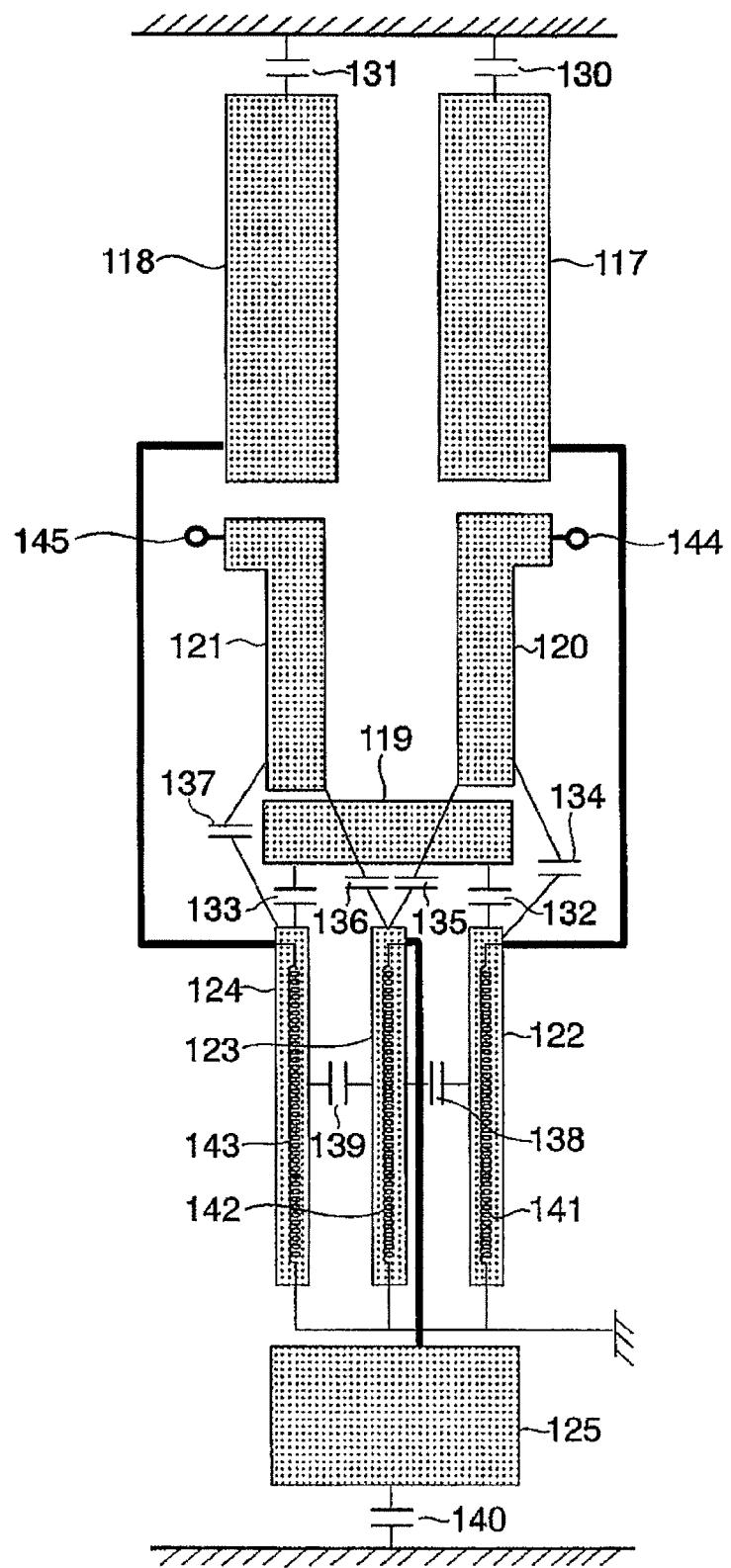
FIG. 12 is a diagram showing reactance formed in the filter of the multilayered substrate.
Figure 13:
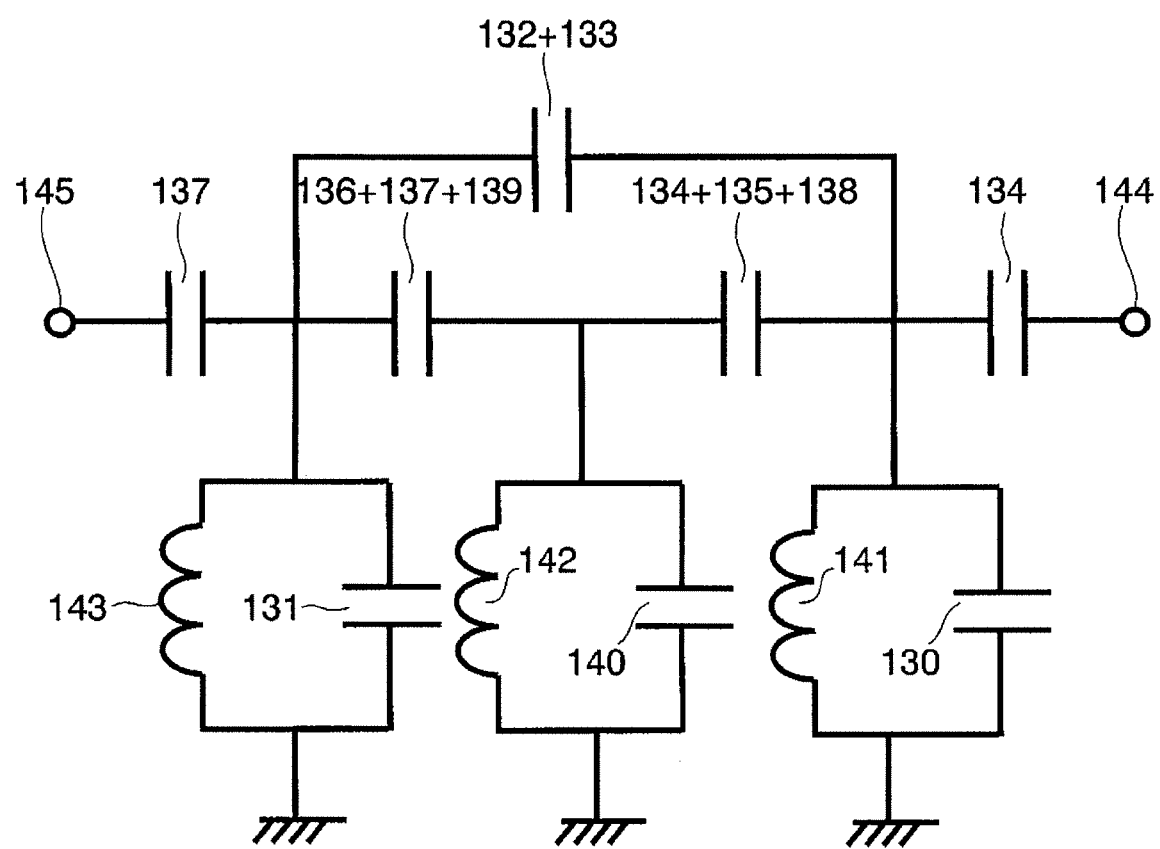
FIG. 13 is a circuit diagram showing the filter.

According to above-mentioned structure, the reactance element is formed in the multilayered substrate. Reference numerals in FIG. 12 are the same as those used in FIG. 11. As described with reference to FIG. 12, a capacitor 130 is formed between the rectangle 117 and the layer L0 and a capacitor 131 is formed between the rectangle 118 and the layer L0. A capacitor 132 is formed between the rectangle 119 and the rectangle 122 and a capacitor 133 is formed between the rectangle 119 and the rectangle 124. A capacitor 134 is formed between the form of inverse L 120 and the rectangle 122 and a capacitor 135 is formed between the inverse L 120 and the rectangle 123. A capacitor 136 is formed between the form of L 121 and the rectangle 123 and a capacitor 137 is formed between the form of L 121 and the rectangle 124. A capacitor 138 is formed between the rectangle 122 and the rectangle 123. A capacitor 139 is formed between the rectangle 123 and the rectangle 124. A capacitor 140 is formed between the rectangle 125 and the lower surface of the layer L6. Further, one ends of the rectangles 122, 123, and 124 are connected to the rectangles 117, 118, and 125 respectively and the other ends are grounded, whereby inductors 141, 142, and 143 are formed. In addition, terminals 144, 145 are provided at ends of the short sides of the form of inverse L 120 and the form of L 121 respectively. Consequently, the formed capacitors and inductors make a filter circuit as shown in FIG. 13.

The invention is described on the basis of the embodiment but the invention is not limited to the above-mentioned configurations, and may be modified in a variety of forms by a person skilled in the art.

What is claimed is:

1. An antenna module integrated with an antenna device comprising:
   an antenna element;
   a multilayered substrate attached to the antenna element;
   a plurality of first components mounted on an exposed face of a first layer of the multilayered substrate, said plurality of first components including a low noise amplifier, a crystal oscillator and a tuner IC, a pattern formed on the exposed face of the first layer providing connections for the first components;
   a plurality of second components built into the multilayered substrate and comprised of patterns formed on a plurality of inner layers of the multilayered substrate, and electrically connected to the plurality of first components through via holes, the plurality of second components including an inductor, a capacitor, a balun and a filter, formed on the basis of at least one of a width, a length, and a shape of patterns formed on inner layers,
   wherein the balun includes:
      a first balun layer of the multilayered substrate, on which juxtaposed connected spiral patterns are formed;
      a second balun layer of the multilayered substrate, on which juxtaposed separated spiral patterns are formed; and
      a third balun layer of the multilayered substrate, on which a connection pattern electrically connecting the separated spiral patterns is formed,
   wherein the connected spiral patterns are disposed to face the separated spiral patterns,
   wherein the filter includes:
      a first filter layer of the multilayered substrate, on which a plurality of first rectangular patterns are formed;
      a second filter layer of the multilayered substrate, on which an L-shaped pattern and an inverse L-shaped pattern are formed;
      a third filter layer of the multilayered substrate, on which a plurality of second rectangular patterns are formed, the number of the second rectangular patterns being larger than that of the first rectangular patterns, the width of each of the second rectangular patterns being smaller than that of each of the first rectangular patterns; and
      a fourth filter layer of the multilayered substrate, on which at least one third rectangular pattern is formed, the number of the at least one of the third rectangular patterns being smaller than that of the first rectangular patterns, the width of the at least one of the third rectangular patterns being larger than that of each of the first rectangular patterns;
   wherein the L-shaped pattern and the inverse L-shaped pattern are disposed to face the first rectangular patterns and the second rectangular patterns;
   wherein one of the first rectangular patterns is electrically connected to one of the second rectangular patterns; and
   wherein one of the second rectangular patterns is electrically connected to the at least one of the third rectangular pattern.

2. The antenna module as set forth in claim 1, wherein the multilayered substrate is a Low Temperature Co-fired Ceramic multilayered substrate.

3. The antenna module as set forth in claim 1, further comprising:
   a housing comprised of a top cover and a bottom plate, the antenna and attached multilayered substrate being positioned within the housing.

* * * * *